(12) United States Patent
Hoskin

(10) Patent No.: US 6,605,160 B2
(45) Date of Patent: Aug. 12, 2003

(54) REPAIR OF COATINGS AND SURFACES USING REACTIVE METALS COATING PROCESSES

(76) Inventor: Robert Frank Hoskin, 3885 Berkeley View Dr., Duluth, GA (US) 30096-3084

(*) Notice: Subject to any disclaimer, the term of this patent is extended or adjusted under 35 U.S.C. 154(b) by 0 days.

(21) Appl. No.: 09/930,932

(22) Filed: Aug. 16, 2001

(65) Prior Publication Data

US 2002/0045053 A1 Apr. 18, 2002

Related U.S. Application Data

(60) Provisional application No. 60/226,295, filed on Aug. 21, 2000.

(51) Int. Cl.$^7$ .............................. C23C 8/36; C23C 8/28; B23P 6/04
(52) U.S. Cl. ...................... 148/222; 148/210; 148/237; 148/279; 427/142
(58) Field of Search ............................ 427/142, 249.17; 148/210, 222, 212, 217, 218, 237, 238, 279

(56) References Cited

U.S. PATENT DOCUMENTS

| | | | |
|---|---|---|---|
| 3,248,251 A | 4/1966 | Allen | |
| 4,460,415 A | 7/1984 | Korhonen | |
| 4,486,462 A | 12/1984 | Asahi et al. | |
| 4,568,396 A | 2/1986 | Vardiman | |
| 4,576,874 A | 3/1986 | Spengler | |
| 4,588,450 A | 5/1986 | Purohit | |
| 4,761,346 A | 8/1988 | Naik | |
| 4,762,756 A | 8/1988 | Bergmann | |
| 4,850,794 A | 7/1989 | Reynolds, Jr. | |
| 5,156,321 A | * 10/1992 | Liburdi et al. | 228/119 |
| 5,197,191 A | * 3/1993 | Dunkman et al. | 29/402.19 |
| 5,272,014 A | 12/1993 | Leyendecker | |
| 5,334,264 A | 8/1994 | Meletis | |
| 5,368,444 A | 11/1994 | Anderson | |
| 5,421,517 A | 6/1995 | Knudson | |
| 5,598,968 A | * 2/1997 | Schaeffer et al. | 228/262.31 |
| 5,606,796 A | * 3/1997 | Fraser | 29/889.1 |
| 5,625,958 A | 5/1997 | DeCoursey | |
| 5,656,364 A | 8/1997 | Rickerby | |
| 5,686,001 A | * 11/1997 | Wrabel et al. | 219/137 PS |
| 5,702,829 A | 12/1997 | Paidassi | |
| 5,813,118 A | 9/1998 | Roedl | |
| 5,840,102 A | * 11/1998 | McCracken | 55/320 |
| 5,958,511 A | 9/1999 | Dolan | |
| 5,972,424 A | * 10/1999 | Draghi et al. | 29/889.1 |
| 5,989,397 A | 11/1999 | Laube et al. | |
| 6,036,995 A | 3/2000 | Kircher et al. | |
| 6,042,880 A | 3/2000 | Rigney et al. | |
| 6,049,978 A | 4/2000 | Arnold | |
| 6,129,988 A | * 10/2000 | Vance et al. | 148/206 |
| 6,306,467 B1 | * 10/2001 | White et al. | 164/459 |
| 6,406,398 B1 | * 6/2002 | Hughes et al. | 475/116 |
| 6,438,933 B1 | * 8/2002 | Watanabe et al. | 57/280 |
| 2002/0066770 A1 | * 6/2002 | James et al. | 228/119 |

OTHER PUBLICATIONS

Richter E. et al, "Nitriding of stainless steel and aluminum alloys by plasma immersion ion implantation", Surface and Coatings Technology, vol. 128–129, 2000, pp. 21–27.

(List continued on next page.)

Primary Examiner—Roy King
Assistant Examiner—Harry D. Wilkins, III

(57) ABSTRACT

This invention pertains to the repair of parts comprising metals, and surfaces and coatings of these parts using reactive metals coating processes. Processes such as chemical vapor deposition (CVD), physical vapor deposition (PVD), plasma spray, and reactive coating (boronizing, carburizing, nitridizing, carbonitridizing, etc.) are known for producing durable coatings or surfaces on metal parts, and the present invention provides a means to spot-repair these coatings or surfaces without excessive buildup of repair material on undamaged areas.

29 Claims, 8 Drawing Sheets

OTHER PUBLICATIONS

Meletis, E.I. et al, "Tribological Characteristics of DLC Films and Duplex Plasma Nitriding/DLC Coating Treatments", Surface and Coatings Technology, vol. 73, 1995, pp. 39–45.

Czerwiec T. et al, "Low–pressure, high–density plasma nitriding: mechanisms, technology and results", Surface and Coatings Technology, vol. 108–109, 1998, pp. 182–190.

Matthews A. et al, "Characteristics of a Thermionically Assisted Troide Ion–Plating System", Thin Solid Films, vol. 80, 1981, pp. 41–48.

Korhonen and Sirvio, "A New Low Pressure Plasma Nitriding Method", Thin Solid Films, vol. 96, 1982, pp. 103–108.

Korhonen et al, "Plasma Nitriding and Ion Plating With an Intensified Glow Discharge", Thin Solid Films, vol. 107, 1983, pp. 387–394.

Fancey and Matthews, "Some Fundamental Aspects of Glow Discharges in Plasma–Assisted Processes", Surface and Coatings Technology, vol. 33, 1987, pp. 17–29.

Ahmed, "Ion Plating Technology, Developments and Applications", John Wiley and Sons, New York, 1987, pp. 68–70.

Fancy and Matthews, "Process Effects in Ion Plating", Vaccum, vol. 41, No. 7–9, 1990, pp. 2196–2200.

Leyland A. et al, "Enhanced Plasma Nitriding at Low Pressures: A Comparative Study of D.C. and R.F. Techniques", Surface and Coatings Technology, vol. 41, 1990, pp. 295–304.

Molarius, J.M. et al, "Ion Nitriding of Steel and Titanium at Low Pressures", 4th Int. Congress on Heat Treatment of Materials, Jun. 3–7, 1985, Berlin (West), Proceedings, vol. 1, p. 625–643, Härterei–Technische Mitteilungen 4(1986)6, 391–398.).

Voevodin, A.A., et al, "Design of a Ti/TiC/DLC Functionally Gradient Coating Based on Studies of Structural Transitions in Ti–C Thin Films", Thin Solid Films, vol. 298, 1997, pp. 107–115.

Gachon Y. et al, "Study of Sand Particle Erosion of Manetron Sputtered Multilayer Coatings", Wear, vol. 233–235, 1999, pp. 263–274.

Dimasi–Marcin and Gupta, "Protective Coatings in the Gas Turbine Engine", Surface and Coatings Technology, vol. 68/69, 1994, pp. 1–9.

Morita, T. et al., "Factors Controlling the Fatigue Strength of Nitrided Titanium", Fatigue & Fracture of Engineering Materials & Structure, vol. 20, No. 1, 1997, pp. 85–92.

Friedrich, L.A., "Improving Turbine Engine Compressor Performance Retention Through Airfoil Coatings", NASA Lewis Research Center Aircraft Engine Diagnostics, Document ID 19810022661 N (81N31203), Jan. 1981, pp. 109–117.

Gravett, P. "The Foreign Object Damage Project of the PRDA V HCF Materials and Life Methods Program", 4th National Turbine Engine High Cycle Fatigue Conference, Monterey, California, USA, Feb. 9, 1999.

Schwind, R.G. et al., "Blade Erosion Effects on Aircraft–Engine Compressor Performance", Department of Energy Report DOE/CS/50095—T2, 1982.

A. Leyland, "Low Temperature Plasma Diffusion Treatment of Stainless Steels for Improved Wear Resistance", Surface and Coatings Technology, vol. 62, 1993, pp. 608–617.

E.I. Meletis, "Intensified Plasma–Assisted Processing: Science and Engineering", Surface and Coatings Technology, vol. 149, 2002, pp. 95–133.

K.–T. Rie, "Recent Advances in Plasma Diffusion Processes", Surface and Coatings Technology, vol. 112, 1999, pp. 56–62.

Bong–Seok Suh, "Surface Hardening of AISI 316L Stainless Steel Using Plasma Carburizing", Thin Solid Films, vol. 295, 1997, pp. 185–192.

K. Bartsch, "Formation of Iron Boride Layers on Steel by D.C.–Plasma Boriding and Deposition Process", Surface and Coatings Technology 116–119, 1999, pp. 386–390.

A.A. Adjaottor, "A Study of the Effect of Energetic Flux Bombardment on Intensified Plasma–Assisted Processing", Ph.D. Thesis, Louisiana State University, Baton Rouge, LA, 1997.

* cited by examiner

REPAIR OF COATINGS AND SURFACES USING REACTIVE METALS COATING PROCESSES

CROSS-REFERENCE TO RELATED APPLICATIONS

This application claims priority from provisional application serial 60/226,295, filed Aug. 21, 2000, entitled "REPAIR OF COATINGS AND SURFACES USING REACTIVE METALS COATING PROCESSES" which is incorporated herein, in its entirety, by reference.

BACKGROUND OF THE INVENTION

This invention pertains to the repair of parts comprising metals, and surfaces and coatings of said parts using reactive metals coating processes. Coating and surface repair fall under U.S. Patent Class 427 (COATING PROCESSES), Subclass 140 (Processes directed to the restoration or repair of coatings or surfaces of objects). Surface treatments via reactive metal coating processes fall under U.S. Patent Class 148 (METAL TREATMENT), Class Definition C ( . . . processes of reactive coating of metal wherein an externally supplied carburizing or nitriding agent is combined with the metal substrate to produce a carburized or nitridized or carbonitrided coating thereon or a uniformly carburized, nitrided, or carbonitrided metal alloy containing a metal element from said substrate) and Class Definition D ( . . . processes of reactive coating of metal wherein an externally supplied agent combines with the metal substrate to produce a coating thereon which contains at least one element from said metal substrate). This invention is applicable in maintenance and restoration of parts in many industries including, but not limited to, aviation and space industries.

Coatings and Surface Treatments

Various processes are well-known for providing coatings or modified surfaces on metals to protect them from effects such as wear, erosion, and corrosion. Such processes include chemical vapor deposition (CVD), physical vapor deposition (PVD), plasma spray, and reactive coating (boronizing, carburizing, nitridizing, carbonitridizing, etc.). For instance, U.S. Pat. No. 5,272,014 (Leyendecker) teaches a wear-resistant CVD coating for substrates such as forming or cutting tools. U.S. Pat. No. 5,656,364 (Rickerby) and U.S. Pat. No. 5,702,829 (Paidassi) teach multiple-layer erosion-resistant PVD coatings for substrates such as gas turbine engine compressor or turbine blades. U.S. Pat. No. 4,850,794 (Reynolds, Jr.) teaches solution-bath and gas nitriding to enhance the wear-resistance of steam turbine components. U.S. Pat. No. 4,588,450 (Purohit) teaches nitriding of nickel-based super alloys including inconel to improve their creep strength, fatigue strength, and resistance to oxidation. U.S. Pat. No. 6,129,988 (Vance , et al.) teaches gas nitriding of metallic bond coatings for thermal barrier coating systems. Nitriding of metallic bond coatings enhances oxidation resistance thereby prolonging the adherence of ceramic thermal barrier coatings applied thereon. CVD, PVD and plasma spray processes generally involve deposition of additional material on the surface of a substrate. Reactive coating processes generally involve incorporation or dispersion of additional chemical constituents into the existing lattice structure of a metal substrate.

Functionally Gradient Surfaces

Reactive coating processes are known for producing treated surfaces with chemical compositions that vary as a function of depth, also known as functionally gradient surfaces. For instance, surfaces produced via nitriding consist of a hard nitride layer above a nitrogen-containing diffusion zone, with nitrogen content gradually decreasing deeper into the substrate material. Richter discusses a plasma nitriding process for producing functionally gradient surfaces on stainless steel and aluminum alloys ("Nitriding of Stainless Steel and Aluminum Alloys by Plasma Immersion Ion Implantation", Surface and Coatings Technology, Vol. 128–129, 2000, pp. 21–27). U.S. Pat. No. 4,762,756 (Bergmann) teaches a plasma nitriding process that is enhanced using arc discharge, whereby functionally gradient surfaces are produced on metals including stainless steel and titanium. Meletis discusses an enhanced plasma nitriding process for producing functionally gradient surfaces on titanium ("Characteristics of DLC Films and Duplex Plasma Nitriding/DLC Coating Treatments", Surface and Coatings Technology, Vol. 73, 1995, pp. 39–45). This (enhanced nitriding process is also taught in expired U.S. Pat. No. 4,460,415 (Korhonen, issued Jul. 17, 1984) and U.S. Pat. No. 5,334,264 (Meletis, issued Aug. 2, 1994). U.S. Pat. No. 4,568,396 (Vardiman) teaches a carburizing method via carbon ion implantation wherein carbon content of the treated surface varies as a function of depth. PVD and CVD processes are better-known for producing coatings of uniform composition as a function of depth (monolayers), but can also be adapted to produce functionally gradient surfaces. For example, U.S. Pat. No. 5,989,397 (Laube) teaches a method and apparatus for producing deposited surfaces with depth-varying compositions of titanium, carbon, and nitrogen.

Enhanced Plasma Nitriding

A review of enhanced nitriding processes is presented by Czerwiec et al ("Low-pressure, high-density plasma nitriding: mechanisms, technology and results", Surface and Coatings Technology, Vol. 108–109, 1998, pp. 182–190). These processes can be classified under the following four categories: Thermionically assisted d.c. triode (TAT); plasma immersion ion implantation (PIII) or plasma source ion implantation (PSII); electron cyclotron resonance (ECR) systems; and thermionic arc discharge (TAD). A version of the TAT enhanced plasma nitriding method and apparatus presented by Meletis in U.S. Pat. No. 5,334,264 is previously taught by expired U.S. Pat. No. 4,460,415 (Korhonen), and also by earlier references including Matthews and Teer ("Characteristics of a Thermionically Assisted Triode Ion-Plating System", Thin Solid Films, Vol. 80, 1981, pp. 41–48), Korhonen and Sirvio ("A New Low Pressure Plasma Nitriding Method", Thin Solid Films, Vol. 96, 1982, pp. 103–108), Korhonen et al ("Plasma Nitriding and Ion Plating With an Intensified Glow Discharge", Thin Solid Films, Vol. 107, 1983, pp. 387–394), Fancey and Matthews ("Some Fundamental Aspects of Glow Discharges in Plasma-Assisted Processes", Surface and Coatings Technology, Vol. 33, 1987, pp. 17–29), Ahmed ("Ion Plating Technology, Develoments and Applications", John Wiley and Sons, New York, 1987, pp. 68–70), Fancy and Matthews ("Process Effects in Ion Plating", Vacuum, Vol. 41, No. 7–9, 1990, pp. 2196–2200), and Leyland et al ("Enhanced Plasma Nitriding at Low Pressures: A Comparative Study of D. C. and R. F. Techniques", Surface and Coatings Technology, Vol. 41, 1990, pp. 295–304. Furthermore, Molarius et al teaches that the process of U.S. Pat. No. 4,460,415 (Korhonen) can be used to treat titanium ("Ion Nitriding of Steel and Titanium at Low Pressures", 4th Int. Congress on Heat Treatment of Materials. Jun. 3–7, 1985. Berlin (West), Proceedings, Vol I, p. 625–643. H ärterei-Technische Mitteilungen 4(1986)6, 391–398.). These references establish prior art that pre-dates the filing of the Meletis Patent by 2 to 10 years. None of these references is cited in the Meletis Patent. U.S. Pat. No. 5,334,264 therefore teaches very little that was not previously taught by prior art.

Performance of Functionally Gradient Surfaces

Functionally gradient surfaces are known to have superior wear and erosion properties compared to monolayer coatings. Voevodin presents results of scratch tests for multiple-layer titanium, titanium carbide, and diamond-like carbon (DLC) surfaces prepared using the process of U.S. Pat. No. 5,989,397 ("Design of a Ti/TiC/DLC Functionally Gradient Coating Based on Studies of Structural Transitions in Ti-C Thin Films", Thin Solid Films, Vol. 298, 1997, pp. 107–115). Meletis presents results of wear tests for functionally gradient, nitrided titanium surfaces ("Characteristics of DLC Films and Duplex Plasma Nitriding/DLC Coating Treatments", Surface and Coatings Technology, Vol. 73, 1995, pp. 39–45). Gachon presents results of erosion tests for functionally gradient, multiple-layer tungsten carbide coatings ("Study of Sand Particle Erosion of Magnetron Sputtered Multilayer Coatings", Wear, Vol. 233–235, 1999, pp. 263–274). Gupta presents results showing that PVD multilayer titanium nitride coatings have superior erosion resistance compared to titanium nitride monolayer coatings on turbine engine compressor blades ("Protective Coatings in the Gas Turbine Engine", Surface and Coatings Technology, Vol. 68/69, 1994, pp. 1–9). Because of their superior performance, functionally graded surfaces are preferred over monolayer coatings. In general, thicker coatings or surface treatments (monolayer or functionally gradient) tend to provide better wear and erosion protection.

Surface Treatments and Fatigue Strength

Coating or surface treatment thickness determines not only wear and erosion resistance, but can also affect fatigue strength of the substrate. For instance, previous attempts to plasma nitride titanium and titanium alloys have most often produced surfaces with increased wear resistance, but often reductions in substrate fatigue strength. Morita presents a list of references dating from 1964 to 1996 for which this is true ("Factors Controlling the Fatigue Strength of Nitrided Titanium", Fatigue & Fracture of Engineering Materials & Structures, Vol. 20, No. 1, 1997, pp. 85–92). Morita also shows the relationship between substrate fatigue strength, substrate grain size, and surface treatment depth (case depth) for nitrided titanium. Morita gas nitrided samples at temperatures from 620 degrees C. to 1200 degrees C. to achieve a range of case depths and grain sizes. Results show that for equivalent grain sizes, the fatigue strength of nitrided titanium with a case depth of 40 micrometers is greater than the fatigue strength of the untreated substrate. When the case depth is increased to 100 micrometers (same grain size), fatigue strength of the nitrided material is significantly decreased compared to the untreated substrate. These results apply over a wide range of grain sizes. The diffusion zone of the nitrided surface appears to help suppress crack propagation in the substrate, but only to a limited degree. The tendency of the 40 micrometer depth case to fracture and initiate substrate crack growth tends to be countered by decreased tendency for slip and dislocations in the diffusion zone. Under a similar level of substrate strain the 100 micrometer case is more likely to fracture, and the diffusion zone is unable to counter the increased tendency for crack growth. Morita's results also indicate that long nitriding times at high temperatures tend to degrade fatigue strength via excessive case thickness and excessive grain growth (e.g., material annealing).

Degradation of fatigue strength due to thick coatings on turbine engine compressor blades is mentioned by Friedrich ("Improving Turbine Engine Compressor Performance Retention Through Airfoil Coatings", NASA Lewis Research Center Aircraft Engine Diagnostics, Document ID 19810022661 N (81N31203), January 1981, pp. 109–117) and in U.S. Pat. No. 4,761,346 (Naik). There appears to be a correlation between thick coatings and degradation in fatigue strength. Thicker coatings tend to provide better wear and erosion protection but often at the expense of fatigue strength. These factors must be considered carefully for coatings and surface treatments, particularly in applications where superior fatigue strength is important.

Surface Damage and Repair

Despite improved protection of the substrate, monolayer coatings or functionally gradient surfaces will eventually wear, erode, or corrode in-service and the underlying metal substrate can be exposed. In general, damage to coated or treated surfaces is not uniform, and consists of local damage sites surrounded by areas where the coating or surface treatment is intact. This is particularly true in cases where the surface has experienced impact or micro-chipping damage due to erosive service conditions. For instance, Gupta shows localized damage to a titanium nitride coated turbine engine compressor blade ("Protective Coatings in the Gas Turbine Engine", Surface and Coatings Technology, Vol. 68/69. 1994, pp. 1–9). Once damaged, coated or treated parts must be restored or repaired to reestablish the original level of protection provided to the substrate.

Damaged areas of some coatings can be cleaned of loose debris and the surface spot-repaired or re-coated. For instance, U.S. Pat. No. 5,958,511 teaches a process for spot-repairing conversion coatings such as Alodine (Henkel Surface Technologies, Madison Heights, Mich.—formerly Parker-Amchem). U.S. Pat. No. 3,248,251 (Allen) describes aluminum-filled inorganic phosphate overlay coatings that are used to protect components in turbomachinery. A commercial version of this coating manufactured by Sermatech International Inc. (Limerick, Pa.) is reportedly spot-repairable. U.S. Pat. No 6,042,880 (Rigney) teaches repair and spot-repair of metallic bond coats used under thermal barrier coatings (TBCs) on turbine blades, wherein the TBC is completely removed to expose the bond coat, then the bond coat spot-repaired. Rigney emphasizes that complete removal of the TBC and bond coat, and simultaneous unintentional removal of substrate is detrimental to blade fatigue life.

Other more durable coatings including some produced via CVD, PVD, or plasma spray processes are not typically spot-repaired. Usual practice for these coatings is to completely remove all old surface materials, thereby helping to ensure the integrity of the replacement coatings. For instance, U.S. Pat. No. 5,368,444 (Anderson) discusses the strip and re-coat of copper-nickel-indium anti-fretting and anti-wear coatings commonly employed on compressor and (turbine blade dovetails. U.S. Pat. No. 5,813,118 (Roedl) and U.S. Pat. No. 6,049,978 (Arnold) describe grit blast and chemical stripping for turbine engine airfoils. U.S. Pat. No. 5,421,517 (Knudson) teaches a waterjet removal process for gas turbine engine components and also aircraft exterior surfaces. U.S. Pat. No. 6,036,995 (Kircher) teaches removal of the surface layer of a metallic coating by first applying a slurry of aluminum in an inorganic binder to the surface of a part coated with the coating, then heating the coated part to melt the aluminum which flows inward into the surface and reacts with the surface to form a brittle aluminide layer, and finally removing the layer via chemical or physical means. Coating removal processes such as these can be effective, but tend to be slow, equipment-intensive, or labor-intensive for removing durable coatings and are therefore expensive. A means to easily remove and/or spot-repair coatings such as these is needed in the art.

Another aspect of coating or surface treatment repair is addressing significant wear or damage that extends into the substrate material. In some applications, infrequent but severe damage events can occur that will breach protective coatings and penetrate deeply into the substrate. For instance, Gravett presents data from a field inspection campaign of foreign object damaged turbine engine compressor blades ("The Foreign Object Damage Project of the PRDA V HCF Materials and Life Methods Program", 4th National Turbine Engine High Cycle Fatigue Conference, Monterey, Calif., USA, Feb. 9, 1999). Data presented shows that the depth of foreign object damage to compressor blades can range from 0.02 inches to 0.5 inches, with an average depth of 0.06 inches. This average damage depth is much greater than a typical protective coating or treated surface.

Surface damage to such depths is unacceptable for some applications, but is acceptable for others. In the case of cutting tools, significant erosion or wear of the tool will cause parts machined by the tool to be out of tolerance and therefore unacceptable. However, in the case of turbine engines, significant wear and erosion on in-service compressor blades is commonplace. Gupta presents data showing local compressor airfoil erosion can be on the order of 10 percent of the original airfoil chord ("Protective Coatings in the Gas Turbine Engine", Surface and Coatings Technology, Vol. 68/69, 1994, pp. 1–9). Schwind presents similar, but more detailed information regarding blade erosion ("Blade Erosion Effects on Aircraft-Engine Compressor Performance", Department of Energy Report DOE/CS/50095-T2, 1982) In fact, special procedures have been developed to classify and repair such damage to turbine engine blades. U.S. Pat. No. 5,625,958 (DeCoursey) teaches a method to determine the service life remaining in a blade after erosion has occurred. U.S. Pat. No. 5,197,191 (Dunkman) teaches a method and apparatus to repair gouged out and damaged leading and trailing edges of gas turbine engine blades by cutting away a curved section including the damaged area and forming a blend radius along the repaired edge. Clearly, it would be advantageous to coat or surface treat parts such as turbine engine airfoils to improve their erosion resistance and durability, yet retain the ability to repair the parts as is common in the art.

BRIEF SUMMARY OF THE INVENTION

The present invention discloses and teaches restoration of durable coatings or surface treatments on metal substrates and how to overcome deficiencies of the prior art.

Various embodiments of this invention disclose and teach the following methods of how to:

Restore damaged durable coatings or surface treatments on metal substrates.

Restore damaged CVD, PVD, plasma spray, and reactive coatings or surface treatments on metal substrates.

Restore damaged functionally gradient coatings or surface treatments on metal substrates.

Spot-repair damaged durable coatings or surface treatments on metal substrates.

Restore protective surfaces on the damaged areas of substrates without excessive buildup of repair material on undamaged areas.

Spot-repair durable coatings or surface treatments while allowing smoothing and blending of local part damage to acceptable conditions or dimensions prior to conducting the surface repair.

Spot-repair durable coatings or surface treatments to restore the protective surface over weld repair areas on metal substrates.

Reduce the difficulty of removing protective top-coats from metal substrates as part of surface repairs.

Reduce the difficulty of removing protective top-coats from metal substrates in conjunction with spot-repair of coatings or surface treatments that lie between the top-coats and the substrates.

Other objects, features, and advantages of the present invention will become apparent upon reading the following detailed description of the preferred embodiment of the invention when taken in conjunction with the drawings and the appended claims.

All articles deriving from the methods disclosed in this invention are within the scope of this invention.

DETAILED DESCRIPTION OF THE INVENTION

Surface Repair Process

Figure 1:
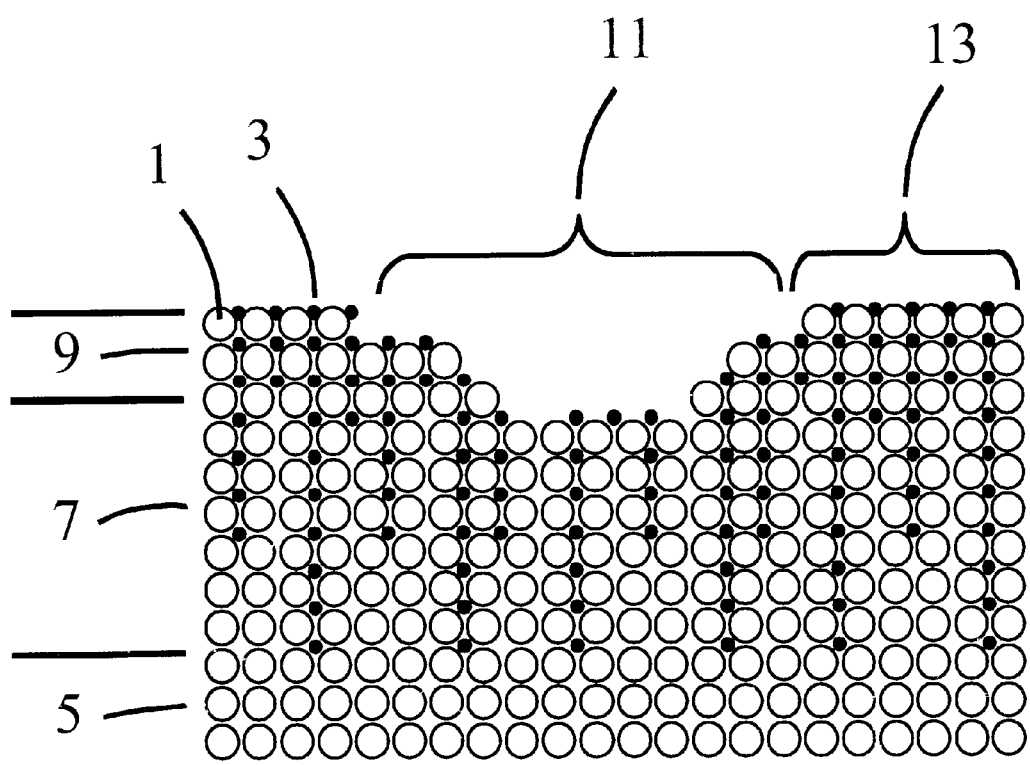
FIG. 1 represents a portion of a functionally gradient surface with damaged and undamaged areas.

FIG. 1 represents a portion of a functionally gradient surface. Substrate atoms 1 comprise substrate 5. Substrate atoms 1 may comprise a single metal or an alloy of several elements. Substrate atoms 1 and interstitial atoms 3 comprise gradient layer 7 and hard surface layer 9. Interstitial atoms 3 may comprise a single element or multiple elements. Some interstitial atoms 3 in gradient layer 7 and surface layer 9 may be chemically combined with substrate atoms 1 to form compounds of the elements present. Surface layer 9 consists primarily of such compounds. Portions of gradient layer 7 and hard surface layer 9 are missing in damaged area 11. Gradient layer 7 and hard surface layer 9 are intact in undamaged area 13.

Figure 2:
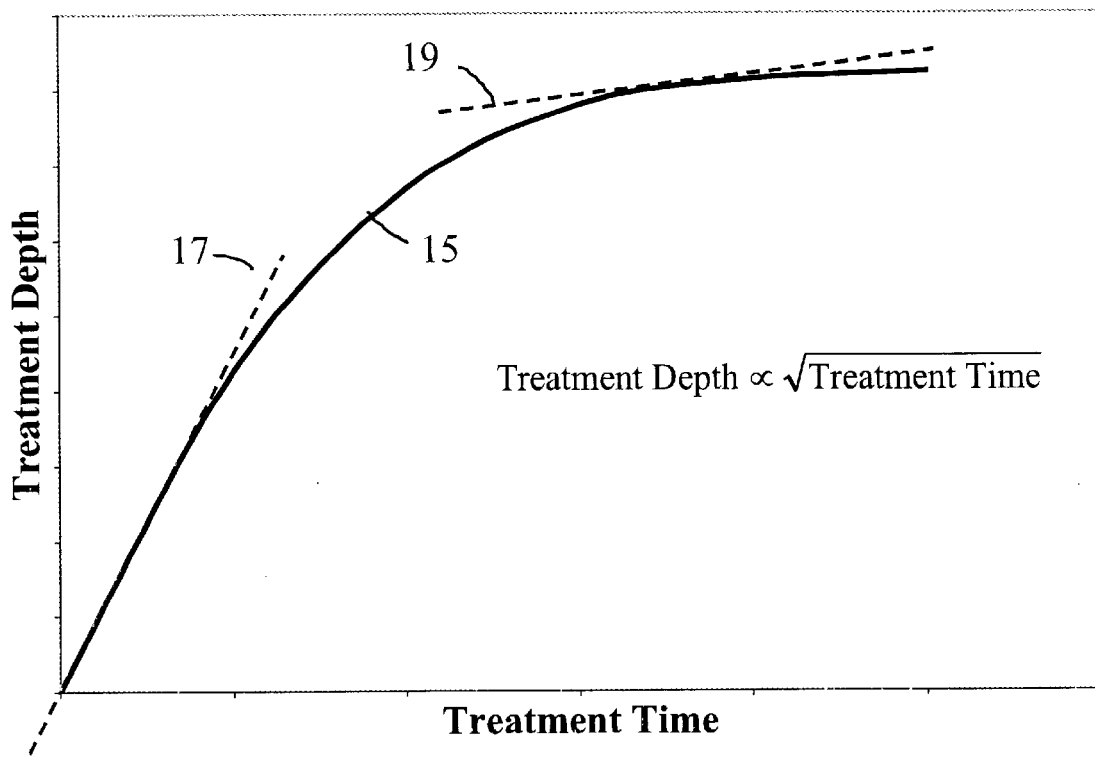
FIG. 2 represents a time vs. treatment depth curve for reactive metals processes.

FIG. 2 represents a time vs. treatment depth curve 15 for a typical reactive metals process that could include but is not limited to boronizing, carburizing, nitridizing and carbonitridizing. In such processes, depth of treatment is dependant upon volume diffusion of interstitial atoms though the lattice of substrate atoms. Depth of treatment is proportional to the square root of time. Therefore, beginning treatment rate 17 is substantially higher than final treatment rate 19. Diffusion of interstitial atoms slows as surface treatment depth increases, (hereby decreasing treatment rate as time progresses.

Figure 3A:
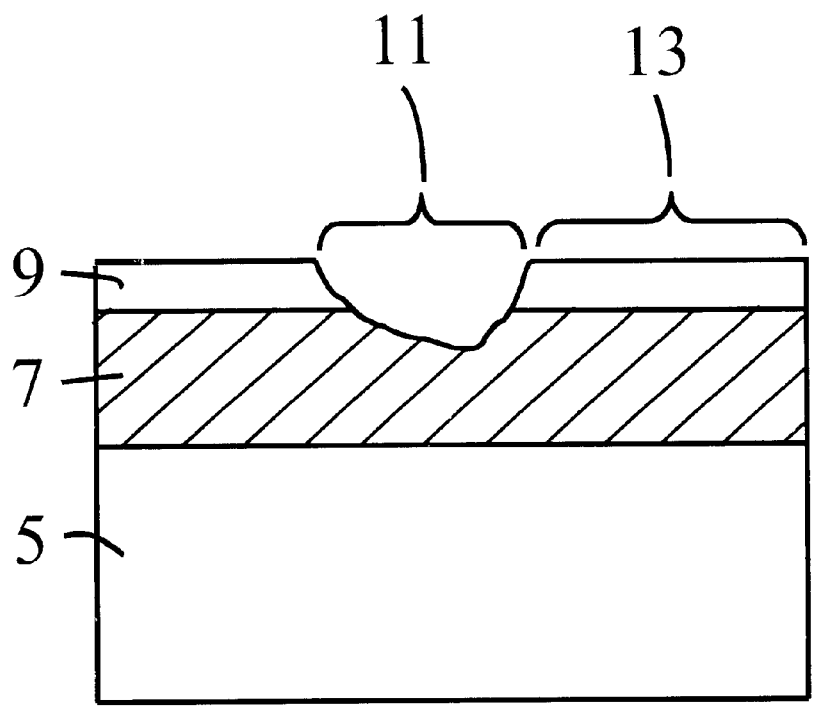
FIG. 3A represents a portion of a functionally gradient surface with damaged and undamaged areas.
Figure 3B:
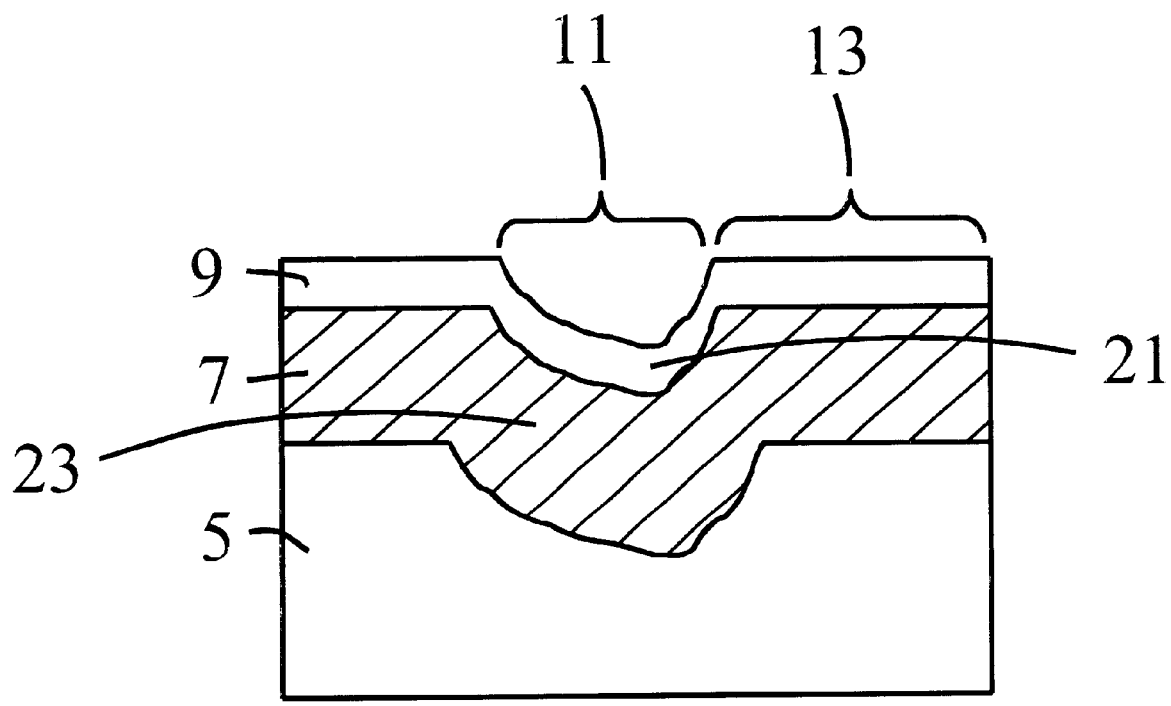
FIG. 3B represents the surface of FIG. 3A after repair of the present invention.

Referring to FIGS. 1 and 2, the outcome of applying the process of FIG. 2 to the damaged surface of FIG. 1 is as follows: The missing surface layer and thinned gradient layer in damaged area 11 present less of a diffusion barrier to additional treatment. Damaged area 11 therefore initially experiences a much higher rate of interstitial atom diffusion than undamaged area 13, e.g., initial treatment rate 17. As the process continues treatment rate slows to final rate 19, and surface treatment depth in the damaged area increases to nearly the same depth as in the original undamaged area—refer to FIG. 3. This results in repaired hard surface 21 and repaired gradient layer 23. Note that damaged area 11 is not built-up to replenish the missing material, and that undamaged area 13 receives little additional treatment. The preferred reactive metals process for the present invention is enhanced plasma nitriding as taught in expired U.S. Pat. No. 4,460,415 (Korhonen). The use of this and other reactive metals processes to create such spot-repairs is not known in the prior art.

Repair Process Optimization

Figure 4:
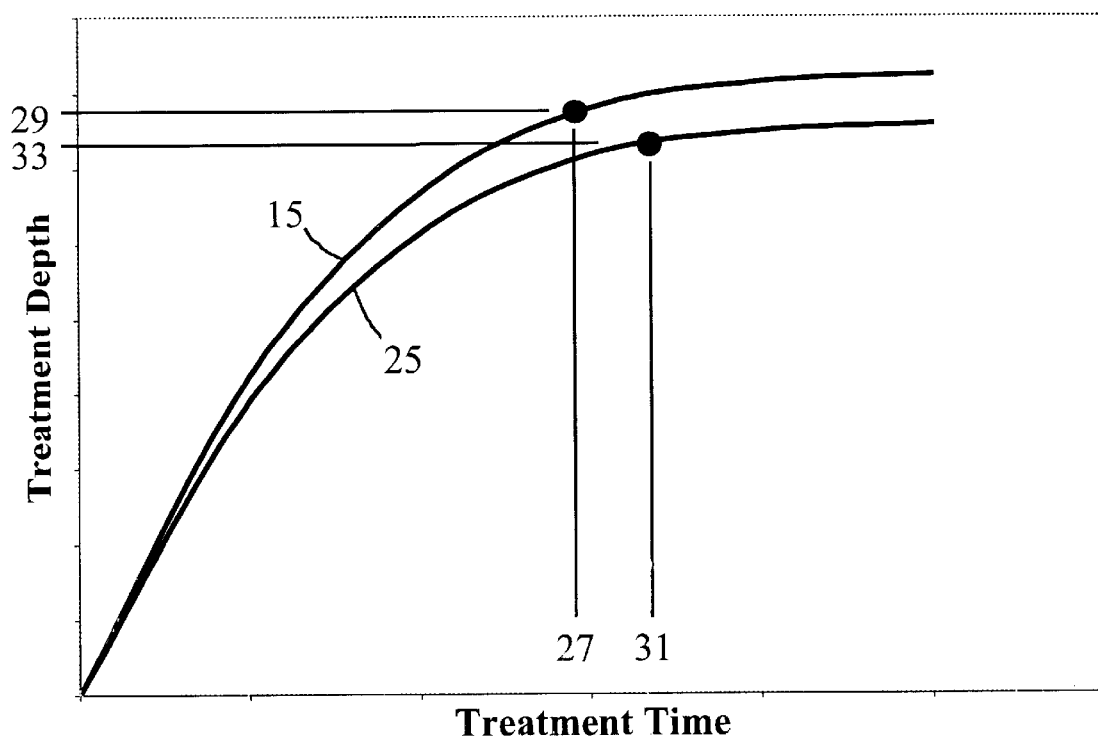
FIG. 4 represents a repair treatment curve of the present invention compared to a reactive metals process used to form the original surface.

Minimal treatment of undamaged areas is extremely important from a surface repair standpoint. This means that damaged areas can effectively be "spot-repaired" without excessive build up in undamaged areas. This avoids problems associated with excessive surface treatment depth such as reduced fatigue strength. In fact, the repair treatment can be purposely made less efficient to ensure no additional treatment in undamaged areas. Refer to FIG. 4. Treatment curve 15 from FIG. 2 is shown along with repair curve 25. Original treatment time 27 establishes original treatment depth 29. Repair curve 25 is selected to produce a slightly decreased depth of treatment than original treatment curve 15 for an equivalent treatment time. For example, in plasma nitriding this can be accomplished using process changes that include, but are not limited to higher vacuum chamber pressures and lower treatment voltages. Repair treatment time 31 can be selected to be slightly longer than original treatment time 27. This produces repair treatment depth 33 that is nearly the same as original treatment depth 29. This repair optimization ensures that depth of treatment for damaged areas is nearly the same as the original treatment depth. However no additional treatment of undamaged areas occurs since final repair treatment depth 33 is less than treatment depth 29 on the undamaged areas. Even if repair treatment time 27 were made significantly longer, the repair curve would not yield additional treatment in undamaged areas. The optimum repair process is defined as that which produces maximum treatment in damaged areas, minimum treatment in undamaged areas, all in minimum time.

EXAMPLE 1

Repair of Turbine Engine Blade Airfoils

Figure 5:
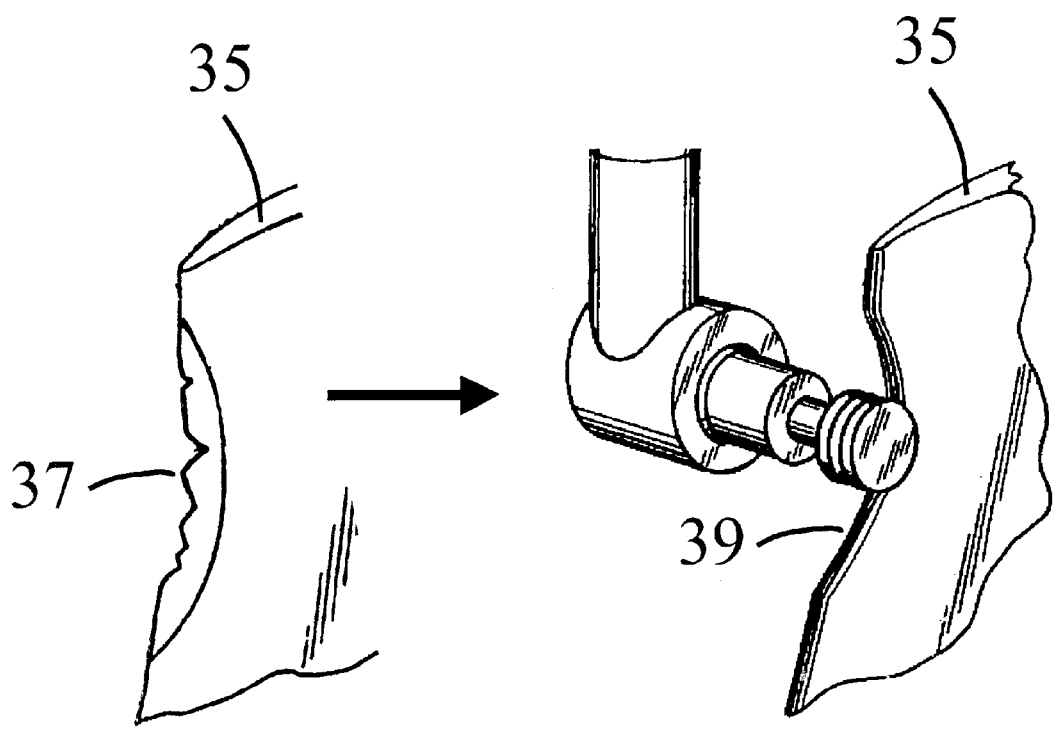
FIG. 5 represents the present invention as applied to airfoil portions of gas turbine engine compressor blades and vanes.

One example application of the present invention is repair of durable surfaces for turbine engine airfoils. For instance, turbine engine compressor blades and vanes suffer from a multitude of degradation mechanisms including erosion, corrosion, impact damage, fretting wear and fretting fatigue. Erosion of airfoil portions of blades and vanes is common. Refer to FIG. 5. Untreated compressor airfoil 35 has damage 37 on the airfoil leading edge. Damage 37 could be due to erosion or foreign object damage (FOD). Standard industry practice for maintaining and repairing uncoated compressor blades involves smoothing and blending minor damage, then returning the blades to service. U.S. Pat. No. 5,197,191 (Dunkman) describes this process. The smoothing and blending produces results represented by smoothed area 39 on airfoil 35.

This process is supplemented using the present invention as follows: A durable functionally gradient surface is applied to airfoil 35 prior to placing it in service. Processes including, but not limited to boronizing, carburizing, nitridizing and carbonitridizing could be used. The functionally gradient surface increases the service life of the blade, but it eventually receives damage and must be repaired. Damage 37 on the airfoil is smoothed and blended per industry standard practice as represented by smoothed area 39, then airfoil 35 undergoes the repair process of the present invention to restore the functionally gradient surface only in the damaged and smoothed areas. As can readily be seen, the repair process of the present invention is compatible with and enhances established industry practices for airfoil repair and use.

EXAMPLE 2

Repair of Turbine Engine Variable Vane Stem Areas

Figure 6:
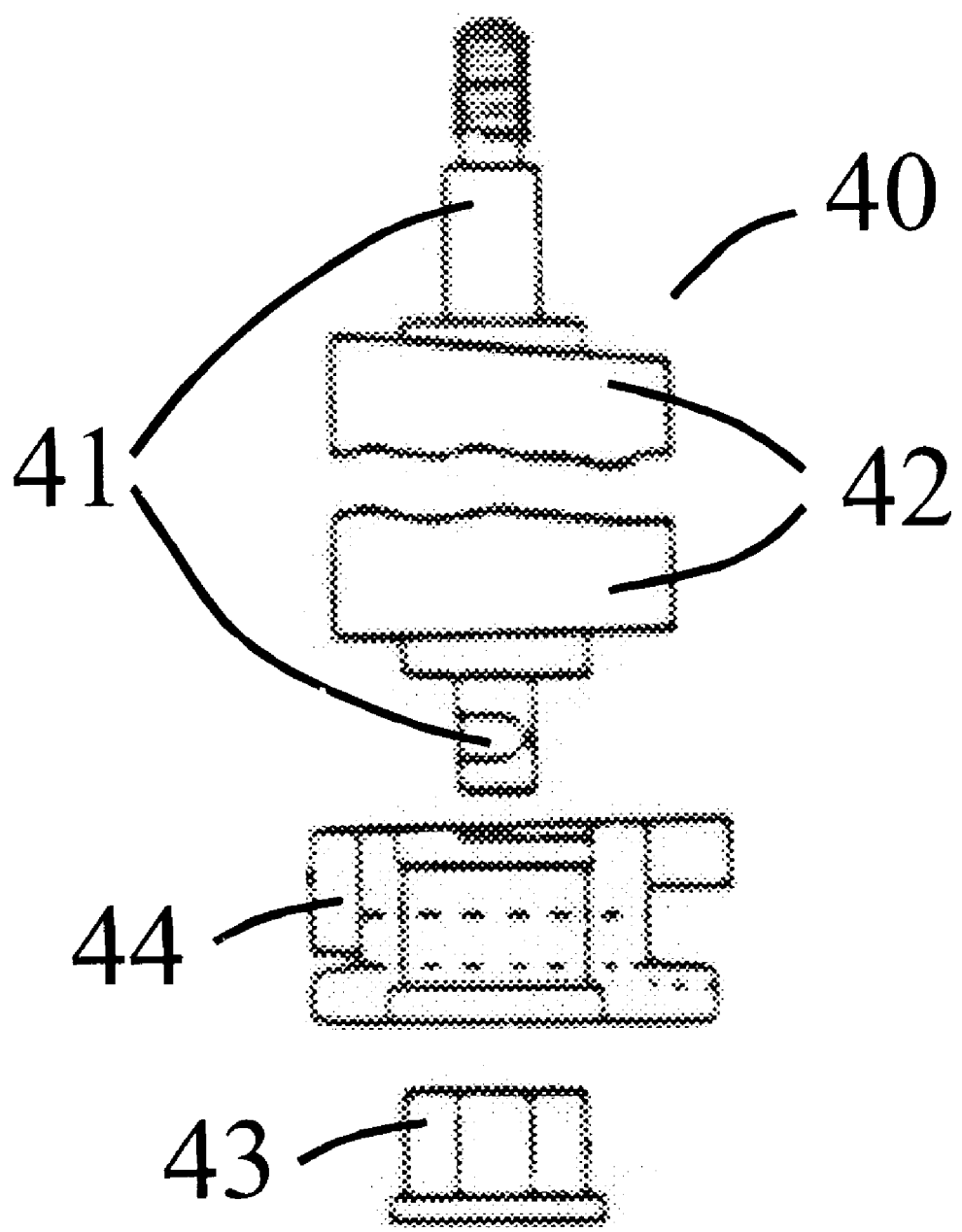
FIG. 6 represents the present invention as applied to stem areas of gas turbine engine compressor variable vanes.

The present invention can also be used to repair the stem areas of variable stator vanes in gas turbine engine compressors. Refer to FIG. 6. Variable stator vane 40 includes stem areas 41 and airfoil areas 42. Also shown are bushing 43 and a portion of the engine casing 44. Stem areas 41 act as rotating bearing surfaces for vane 40 during engine operation and therefore are subject to sliding wear. Stem areas 41 can be, and are preferably repaired simultaneously with airfoil areas 42 using the process described in Example 1. If airfoil areas 42 have experienced wear (erosion) and stem areas 41 have not, the present invention ensures repair of airfoil areas 42 whereas stem areas 41 receive little or no additional treatment.

EXAMPLE 3

Repair of Turbine Engine Blade Dovetail Areas

In Example 1, the focus was repair of the airfoil portion of a turbine engine blade. Dovetail areas of blades could also receive treatment as part of airfoil repair using the present invention. It is important to consider potential impacts of the present invention on repairing dovetail areas. This ensures the present invention does not conflict with existing operational or repair considerations.

Figure 7:
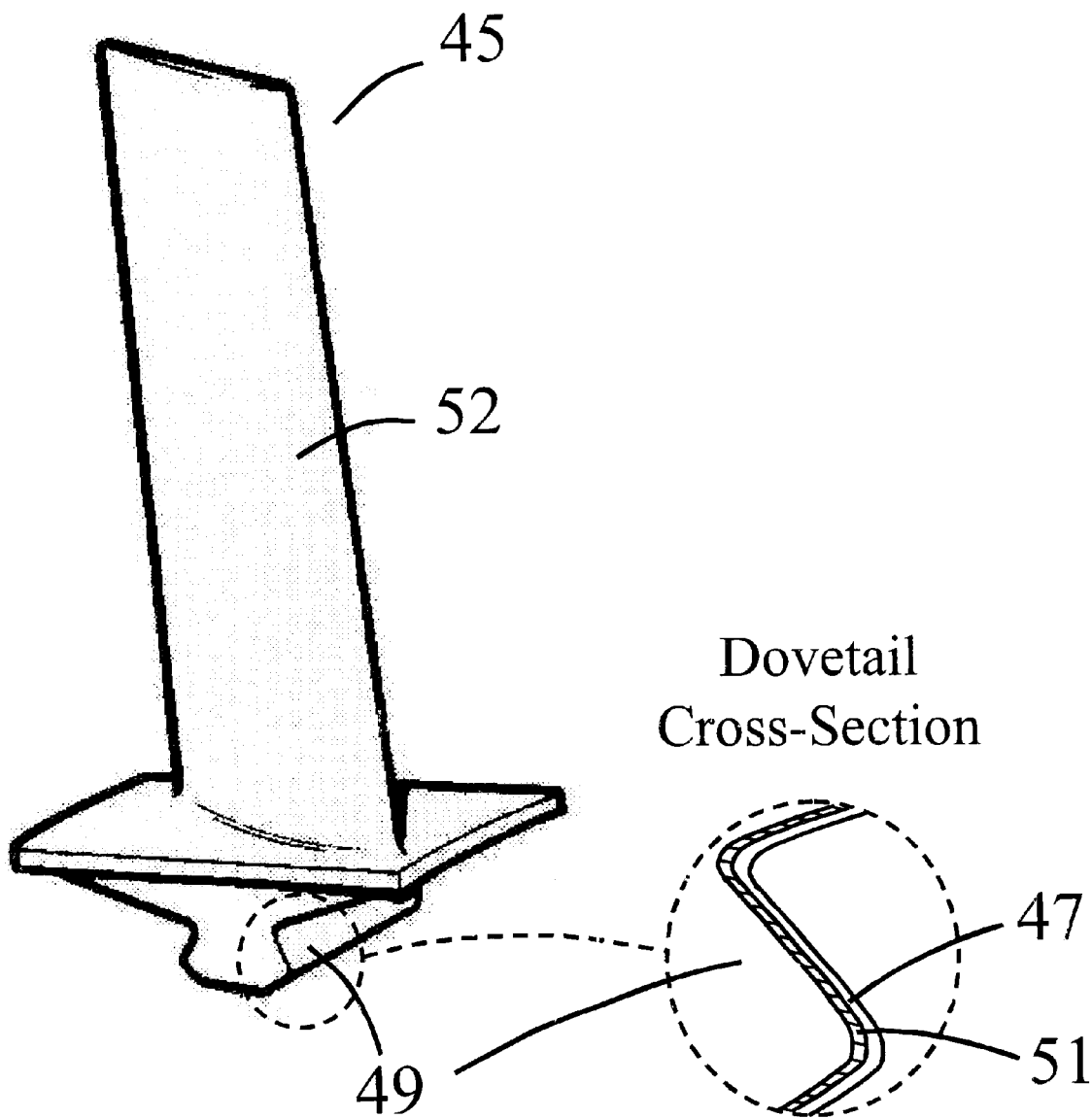
FIG. 7 represents the present invention as applied to dovetail areas of gas turbine engine compressor blades.

Copper-nickel-indium and other soft anti-fretting and anti-wear coatings are commonly employed on compressor and turbine blade dovetails in the prior art. U.S. Pat. No. 5,368,444 (Anderson) describes the use of such coatings. Referring to FIG. 7, blade 45 has anti-fretting or anti-wear coating 47 applied to dovetail areas 49. Coating 47 is often stripped and reapplied as part of blade repair, most often when excessive wear of coating 47 occurs. Dovetail areas 49 can be isolated from the repair process of the present invention by using masking and/or substrate holders that prevent reactive metals treatment of these areas. However, if coating 47 is excessively worn and must be stripped, the present invention is useful for expediting the stripping process.

The present invention is used to supplement repair of dovetail areas 49 as follows: Durable functionally graded surface 51 is applied to blade 45, including dovetail areas 49, prior to applying coating 47. Coating 47 is then applied over functionally gradient surface 51 in the dovetail area, and the blade is placed into service. If coating 47 experiences excessive wear and must be stripped, functionally gradient surface 51 on the dovetail substrate makes these areas more resistant to erosion damage from the stripping process (e.g., grit blasting). Undesired minor dovetail area damage to surface 51 incurred while stripping coating 47 is then repaired using the present invention, preferably in conjunction with repair of airfoil portion 53 of the blade per Example 1. Coating 47 is then reapplied and blade 45 is returned to service.

EXAMPLE 4

Repair of Turbine Engine Blades With Thermal Barrier Coatings

Figure 8:
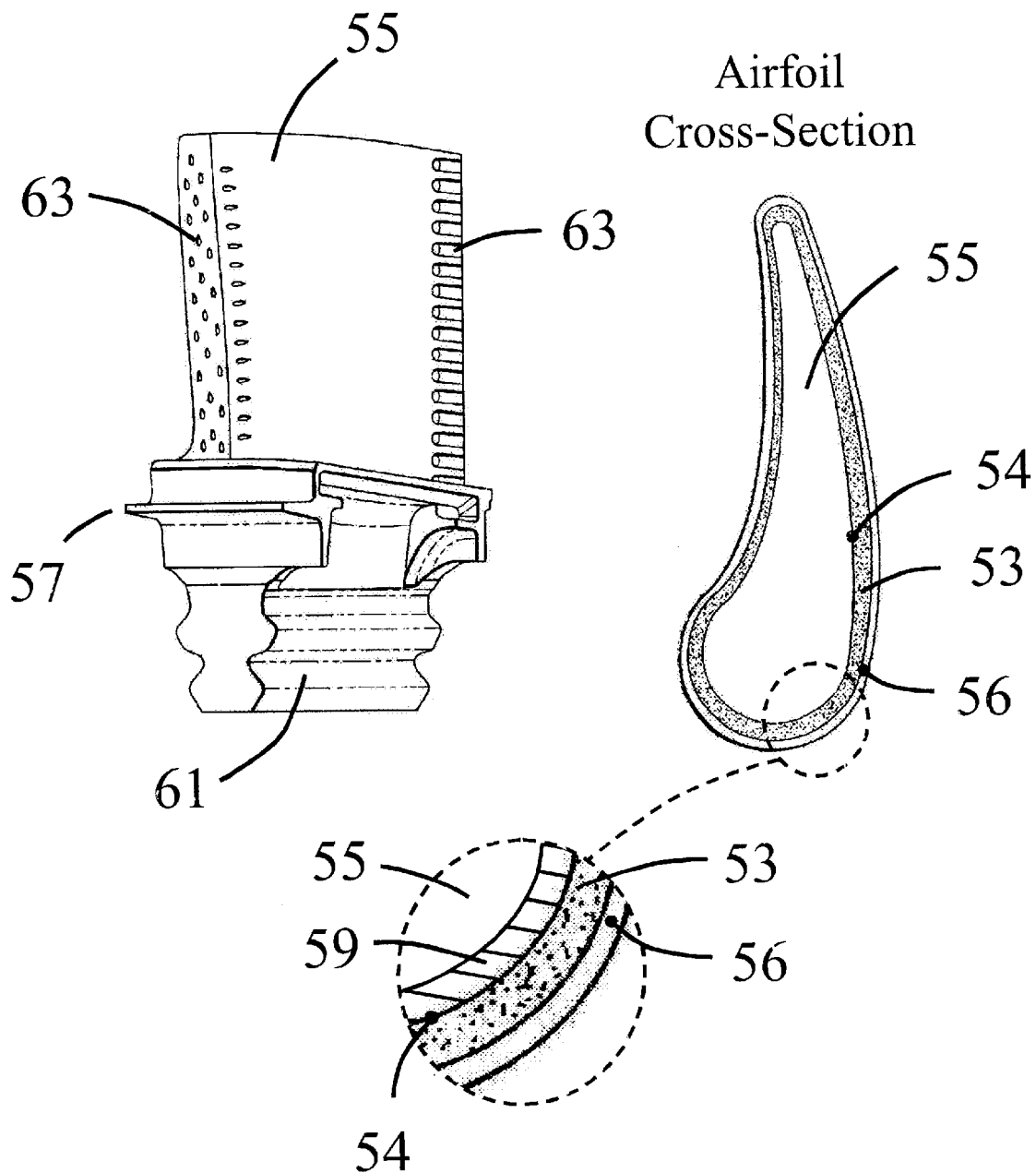
FIG. 8 represents the present invention as applied to airfoil portions of gas turbine engine turbine blades and vanes.

Thermal barrier coatings are often used on turbine blades to protect the underlying metal substrate, and are also commonly stripped using processes including grit blasting as part of repair procedures. U.S. Pat. No. 4,576,874 (Spengler, et al) and U.S. Pat. No. 5,813,118 (Roedl, et al) describe thermal barrier coatings commonly employed. Referring to FIG. 8, thermal barrier coating 53 is applied to airfoil 55 of turbine blade 57. A metallic bond coat 54 is often applied between thermal barrier coating 53 and airfoil 55. Bond coat 54 is compositionally tailored to grow an adherent, predominately aluminum oxide scale to inhibit oxidation of the blade 57 and provide a satisfactory bonding surface for thermal barrier coating 53. Dense overcoat 56 is also sometimes applied over thermal barrier coating 53. Note that cooling holes 63 may be present in airfoil 55. Coatings 53 and 56 are often stripped and reapplied as part of blade repair, most often upon excessive spalling of these coatings. Usual repair practice in the existing art is to strip coatings 53 and 56 using chemical and mechanical means while attempting to leave bond coat 54 intact. If bond coat 54 is damaged it too, must be stripped. U.S. Pat. No. 5,972,424 (Draghi, et al) discusses these repair procedures. Weld repairs of airfoil 55 can also be made as described in U.S. Pat. No. 5,686,001 (Wrabel, et al).

The present invention makes the stripping process more efficient, and is used to supplement repair of airfoil 55 as follows: Durable functionally graded surface 59 is applied to airfoil 55, including fir tree portion 61, prior to applying coatings 54, 53 or 56. Coatings 54, 53 and if necessary 56 are then applied over Functionally gradient surface 59 on airfoil 55 and the blade is placed into service. When coatings 53 and 56 experience excessive wear and must be stripped, functionally gradient surface 59 on the airfoil substrate makes these areas more resistant to erosion (e.g., grit blasting). Undesired minor damage to surface 59 incurred while stripping coatings 54, 53 and 56 is then repaired using the present invention, preferably in conjunction with repair of fir tree portion 61 of the blade per Example 1. The present invention will also restore a functionally gradient surface over weld repair areas. The present invention does not clog cooling holes 63 as can occur with other coating processes. Coatings 54, 53 and if necessary 56 are then reapplied and blade 57 is returned to service. Note that bond coat 54 and dense overcoat 56 may be omitted without departing from the present invention.

Alternatives

It should be understood that the present invention is not restricted to repairing surfaces originally produced using reactive metals coating processes. Functionally gradient surfaces produced using CVD, PVD, plasma spraying and other processes can also be repaired. The repair process of the present invention can also be used to repair such surfaces, providing the elements present and their concentrations by depth are similar to those expected for the repair process.

CONCLUSION

Therefore it may be seen that the present invention includes many advantages, most notably the ability to spot-repair durable functionally gradient surfaces.

While this invention has been described in specific detail with reference to the disclosed embodiments, it will be understood that many variations and modifications may be effected within the spirit and scope of the invention as described in the appended claims.

I claim:

1. A method for repairing a surface on a metal substrate where said surface has a pre-repair chemical composition that varies with depth and at least a portion of said surface is missing from the substrate, the method comprising:

treatment of said surface with a reactive metals process, wherein said reactive metals process substantially excludes deposition of additional material onto said surface.

2. The method of claim 1, including a preceding step to remove loose partialate material from said surface.

3. The method of claim 1, wherein said reactive metals is preceded by a weld repair.

4. The method of claim 3, wherein said weld repair is to at least one of the group that includes airfoil leading edge, airfoil trailing edge, and airfoil tip.

5. The method of claim 4, wherein said airfoil forms at least a portion of a turbine part.

6. The method of claim 5, wherein said airfoil is part of a detachable portion of an aircraft wing.

7. The method of claim 1, wherein said reactive metals process produces a repair chemical composition that varies with depth in areas where said missing portion of said surface is absent from said substrate, wherein said repair chemical composition is similar to said original chemical composition.

8. The method of claim 1, wherein said reactive metals process comprises at least one of boronizing, carburizing, nitridizing, and carbonitridizing.

9. The method of claim 8, wherein said reactive metals process comprises plasma nitriding.

10. The method of claim 9, wherein said reactive metals process comprises plasma nitriding intensified with a thermionic electron emission source.

11. The method of claim 10, wherein said thermionic electron emission source comprises an electrical filament.

12. The method of claim 9, wherein said reactive metals process comprises plasma nitriding intensified with an inductively coupled radio-frequency discharge.

13. The method of claim 9, wherein said reactive metals process comprises plasma nitriding intensified with an arc discharge.

14. The method of claim 9, wherein said reactive metals process comprises plasma nitriding intensified by application of microwave frequency energy.

15. The method of claim 8, wherein said reactive metals process includes at least one of plasma nitriding and plasma carburizing.

16. The method of claim 1, wherein said reactive metals process utilizes at least one element from boron, carbon, and nitrogen.

17. The method of claim 1, wherein said reactive metals process is selected to produce a repair treatment depth that is slightly less than the depth corresponding to said original chemical composition of said surface.

18. The method of claim 1, wherein said surface has a pre-repair depth of treatment corresponding to said pre-repair chemical composition, wherein said reactive metals process is selected to achieve a repair depth of treatment greater than about seventy percent of said pre-repair depth of treatment in areas where said missing portion of said surface is absent from said substrate, wherein said reactive metals process achieves a repair depth of treatment less than about forty percent of said pre-repair depth of treatment in remaining areas of said surface.

19. The method of claim 18, wherein said reactive metals coating process comprises plasma nitriding, and wherein said repair depth of treatment is achieved by said reactive metals coating process by adjusting at least one of substrate temperature, substrate bias voltage, and thermionic emission intensity.

20. A product including at least one surface repaired according to claim 1.

21. The product of claim 20, wherein said product is a gas turbine engine component.

22. The product of claim 21, wherein said product is a component with at least one airfoil portion.

23. The product of claim 22, wherein said product comprises at least one of compressor blades, compressor vanes, turbine blades, and turbine vanes.

24. A method for repairing a surface on a metal substrate where said surface has a pre-repair chemical composition that varies with depth and at least a portion of said surface is missing from said substrate due to at least one of abrasion, erosion, impact damage and corrosion, the method comprising:

treatment of said surface with a reactive metals process, wherein said reactive metals process substantially excludes deposition of additional material onto said surface.

25. A method for repairing a surface on a metal substrate where said surface has a pre-repair chemical composition that varies with depth and at least a portion of said surface is missing from said substrate, the method comprising:

mechanical smoothing in at least the area where said missing portion is absent from said surface.

26. The method of claim 25, wherein said smoothing is preceded by a deposition process wherein additional material is incorporated onto said substrate in areas including where said missing portion is absent from said surface.

27. The method of claim 26, wherein said deposition process is a weld repair.

28. A method for repairing a pre-repair surface on a metal substrate where the surface was produced by at least one of chemical vapor deposition, physical vapor deposition, plasma spray, and reactive metals coating, where said surface has a pre-repair chemical composition that varies with depth and at least a portion of said surface is missing from said substrate, the method comprising:

treatment of said surface with a reactive metals process, wherein said reactive metals process substantially excludes deposition of additional material onto said surface.

29. A method for repairing a surface on a metal substrate where said surface has a pre-repair chemical composition that varies with depth and at least a portion of said surface is missing from said substrate, where said substrate comprises alloys composed of at least one element from the group that includes aluminum, chromium, iron, nickel, and titanium, the method comprising:

treatment of said surface with a reactive metals process, wherein said reactive metals process substantially excludes deposition of additional material onto said surface.

* * * * *